(12) United States Patent
Hsu et al.

(10) Patent No.: US 12,341,058 B2
(45) Date of Patent: Jun. 24, 2025

(54) AIR GAP THROUGH AT LEAST TWO METAL LAYERS

(71) Applicant: GlobalFoundries Singapore Pte. Ltd., Singapore (SG)

(72) Inventors: Wei-Hui Hsu, Singapore (SG); Curtis Chun-I Hsieh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 552 days.

(21) Appl. No.: 17/649,954

(22) Filed: Feb. 4, 2022

(65) Prior Publication Data

US 2023/0253245 A1 Aug. 10, 2023

(51) Int. Cl.
| | |
|---|---|
| *H01L 23/52* | (2006.01) |
| *H01L 21/768* | (2006.01) |
| *H01L 23/522* | (2006.01) |
| *H01L 23/532* | (2006.01) |

(52) U.S. Cl.
CPC .... *H01L 21/7682* (2013.01); *H01L 21/76802* (2013.01); *H01L 21/76831* (2013.01); *H01L 23/5222* (2013.01); *H01L 23/5226* (2013.01); *H01L 23/5329* (2013.01)

(58) Field of Classification Search
CPC ............... H01L 23/5226; H01L 23/485; H01L 23/5222; H01L 23/53295; H01L 23/5329; H01L 23/5283; H01L 29/4991; H01L 29/515; H10D 84/0149

See application file for complete search history.

(56) References Cited

U.S. PATENT DOCUMENTS

| | | | |
|---|---|---|---|
| 5,641,712 A | 6/1997 | Grivna et al. | |
| 5,914,519 A | 6/1999 | Chou et al. | |
| 6,165,890 A | 12/2000 | Kohl et al. | |
| 6,190,988 B1 | 2/2001 | Furukawa et al. | |
| 6,211,561 B1 | 4/2001 | Zhao | |
| 6,316,347 B1 | 11/2001 | Chang et al. | |
| 6,917,109 B2 | 7/2005 | Lur et al. | |
| 6,984,577 B1 | 1/2006 | Zhao et al. | |
| 7,138,329 B2 | 11/2006 | Lur et al. | |
| 7,449,407 B2 | 11/2008 | Lur et al. | |
| 7,553,756 B2 * | 6/2009 | Hayashi | H01L 23/53252 257/E21.573 |

(Continued)

FOREIGN PATENT DOCUMENTS

| | | |
|---|---|---|
| CN | 107665855 A | 2/2018 |
| DE | 4239319 A1 | 4/1993 |

(Continued)

*Primary Examiner* — Ida M Soward
(74) *Attorney, Agent, or Firm* — Anthony Canale; Hoffman Warnick LLC

(57) ABSTRACT

The semiconductor device includes an air gap extending through at least two metal layers. A dielectric lining layer is used on sidewalls of the opening to ensure a uniform width and protect certain cap layers during enlargement of the opening used to form the air gap. The air gap includes remnants of the dielectric lining layer on sidewalls of the air gap. The air gap reduces the capacitance between a transistor gate in a device layer and adjacent wires and vias used to contact the source and drain of the transistor, compared to air gaps in just a single metal layer or stacked air gaps in different layers.

20 Claims, 15 Drawing Sheets

(56) References Cited

U.S. PATENT DOCUMENTS

| | | | |
|---|---|---|---|
| 7,638,428 B2* | 12/2009 | Streck | H01L 21/28562 |
| | | | 438/650 |
| 7,790,601 B1 | 9/2010 | Choi et al. | |
| 8,232,618 B2 | 7/2012 | Breyta et al. | |
| 8,232,653 B2 | 7/2012 | Lee | |
| 8,298,911 B2 | 10/2012 | Lee | |
| 8,350,300 B2 | 1/2013 | Aoki | |
| 9,653,348 B1 | 5/2017 | Wu et al. | |
| 9,659,865 B2 | 5/2017 | Saka et al. | |
| 10,157,777 B2 | 12/2018 | He et al. | |
| 10,157,778 B2 | 12/2018 | Tsai et al. | |
| 10,171,007 B2 | 1/2019 | Verheijden et al. | |
| 10,211,146 B2 | 2/2019 | He et al. | |
| 10,361,152 B2 | 7/2019 | Su et al. | |
| 10,411,107 B2* | 9/2019 | Schutz | H01L 21/823468 |
| 10,707,120 B1* | 7/2020 | Yami | H01L 21/76224 |
| 11,107,884 B2 | 8/2021 | Adusumilli et al. | |
| 11,127,678 B2 | 9/2021 | McGahay et al. | |
| 11,205,609 B2* | 12/2021 | Hsu | H01L 23/485 |
| 11,244,857 B2* | 2/2022 | Tsai | H01L 21/7682 |
| 11,335,638 B2* | 5/2022 | Singh | H01L 23/5226 |
| 11,417,749 B2* | 8/2022 | Singh | H01L 29/78 |
| 12,191,195 B2* | 1/2025 | Tao | H01L 21/7682 |
| 2002/0047207 A1* | 4/2002 | Sekiguchi | H01L 23/5222 |
| | | | 257/E21.589 |
| 2004/0097013 A1* | 5/2004 | Lur | H01L 21/7682 |
| | | | 438/118 |
| 2007/0184615 A1* | 8/2007 | Brazzelli | H01L 21/7682 |
| | | | 257/E21.507 |
| 2008/0020488 A1 | 1/2008 | Clevenger et al. | |
| 2008/0308898 A1 | 12/2008 | Gabric et al. | |
| 2009/0200636 A1 | 8/2009 | Edelstein et al. | |
| 2010/0258882 A1* | 10/2010 | Magnee | B81C 1/00246 |
| | | | 257/415 |
| 2010/0301489 A1 | 12/2010 | Seidel et al. | |
| 2011/0018091 A1 | 1/2011 | Barth et al. | |
| 2011/0193230 A1 | 8/2011 | Nogami et al. | |
| 2012/0037962 A1 | 2/2012 | Breyta et al. | |
| 2012/0058639 A1 | 3/2012 | Sim et al. | |
| 2015/0076705 A1* | 3/2015 | Singh | H01L 23/53295 |
| | | | 257/774 |
| 2015/0243544 A1 | 8/2015 | Alptekin et al. | |
| 2015/0262929 A1 | 9/2015 | Hsiao et al. | |
| 2016/0093668 A1* | 3/2016 | Lu | H01L 23/528 |
| | | | 257/421 |
| 2016/0118335 A1* | 4/2016 | Lee | H01L 23/53266 |
| | | | 257/774 |
| 2016/0133508 A1 | 5/2016 | Gates et al. | |
| 2016/0141240 A1 | 5/2016 | Saka et al. | |
| 2016/0163816 A1 | 6/2016 | Yu et al. | |
| 2017/0186683 A1* | 6/2017 | Lin | H01L 23/53228 |
| 2017/0330790 A1* | 11/2017 | He | H01L 21/76805 |
| 2017/0330832 A1* | 11/2017 | He | H01L 27/1203 |
| 2019/0096742 A1 | 3/2019 | Tsai et al. | |
| 2019/0206718 A1 | 7/2019 | LiCausi et al. | |
| 2020/0020568 A1 | 1/2020 | Lin | |
| 2020/0105928 A1 | 4/2020 | Lee et al. | |
| 2020/0152736 A1 | 5/2020 | Yu et al. | |
| 2021/0083114 A1 | 3/2021 | Wang et al. | |
| 2021/0175166 A1* | 6/2021 | McGahay | H01L 21/7682 |
| 2021/0313233 A1 | 10/2021 | Lee et al. | |
| 2021/0391262 A1* | 12/2021 | Chang | H10D 64/251 |
| 2022/0037503 A1 | 2/2022 | Yang et al. | |
| 2022/0139762 A1* | 5/2022 | Li | H01L 21/02063 |
| | | | 257/774 |
| 2022/0216095 A1* | 7/2022 | Singh | H01L 27/1203 |
| 2022/0302157 A1* | 9/2022 | Kim | H01L 21/76889 |
| 2023/0062416 A1* | 3/2023 | Wu | H01L 21/76831 |
| 2023/0178427 A1* | 6/2023 | Lee | H01L 21/76831 |
| | | | 257/760 |

FOREIGN PATENT DOCUMENTS

| | | |
|---|---|---|
| DE | 4333875 A1 | 4/1995 |
| DE | 102018222690 A1 | 7/2019 |
| TW | 202143391 A | 11/2021 |
| TW | 202201553 A | 1/2022 |

* cited by examiner

AIR GAP THROUGH AT LEAST TWO METAL LAYERS

BACKGROUND

Technical Field

The present disclosure relates to semiconductor devices, and more specifically, to an air gap extending through at least two metal layers, and a method of forming the same. The air gap reduces off-state capacitance ($C_{off}$) in applications such as radio frequency switches in semiconductor-on-insulator (SOI) substrates.

Related Art

Radio frequency (RF) switches are widely used in telecommunications equipment such as smartphones to route high frequency telecommunications signals through transmission paths. For instance, RF switches are commonly used in smartphones to allow use with different digital wireless technology standards used in different geographies. Current RF switches are generally fabricated using semiconductor-on-insulator (SOI) substrates. One challenge with RF switches formed in SOI substrates is controlling two competing parameters: on-resistance ($R_{on}$) which is the resistance of the switch when power is switched on, and off-state capacitance ($C_{off}$) which indicates the amount of cross-talk or noise that may occur within the system, i.e., the amount transmitted signals on one circuit creates an undesired effect on another circuit. $R_{on}$ is preferred to be as low as possible when the RF switch is on to reduce the power consumption, and $C_{off}$ should be minimized to reduce undesired coupling noise. In conventional semiconductor manufacturing processes, lowering either $R_{on}$ or $C_{off}$ results in the opposite effect in the other parameter.

SUMMARY

A first aspect of the disclosure is directed to a method, comprising: forming an opening having a depth extending into at least two metal layers over a device layer; forming a dielectric lining layer over at least a sidewall of an upper portion of the opening; enlarging at least a portion of the opening that is not covered by the dielectric lining layer; and forming an air gap through the at least two metal layers by forming an interlayer dielectric layer over the opening to seal the opening, wherein some of the dielectric lining layer remains on a sidewall of the air gap.

A second aspect of the disclosure includes a semiconductor device, comprising: a device layer including a transistor gate; at least two metal layers over the device layer; and an air gap extending through each of the at least two metal layers.

A third aspect of the disclosure related to a radio frequency semiconductor-on-insulator (RFSOI) switch, comprising: a transistor gate in a semiconductor-on-insulator (SOI) device layer of an SOI substrate; at least two metal layers over the SOI device layer; and an air gap extending through each of the at least two metal layers.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
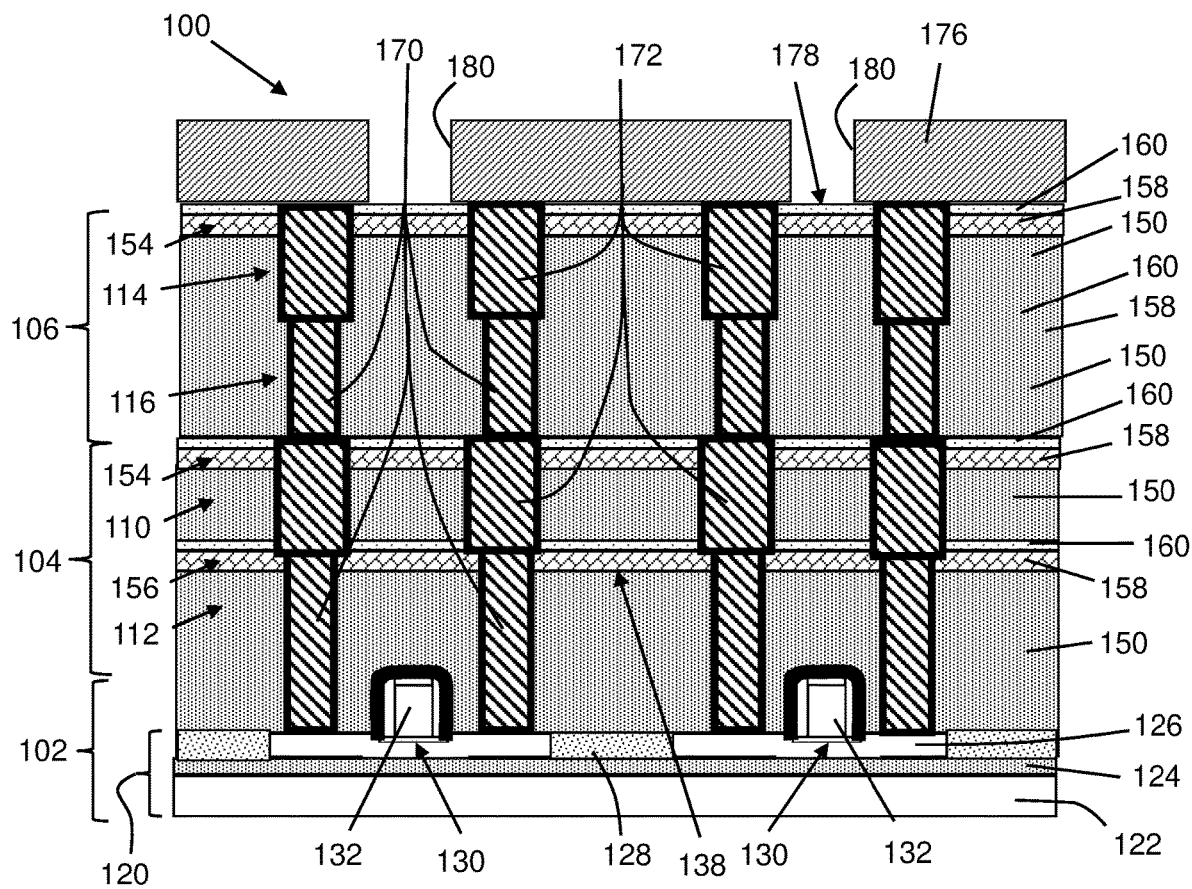
FIG. 1 shows a cross-sectional view of embodiments of an initial structure for a method according to the disclosure.

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The present disclosure relates to methods of forming semiconductor devices including an air gap extending through at least two metal layers, and the semiconductor device so formed. The air gap reduces the capacitance between a transistor gate in a device layer and adjacent wires and vias used to contact the source and drain of the transistor, compared to air gaps in just a single metal layer or stacked air gaps in different layers. This capacitance reduction may decrease the off-state capacitance of the transistor when it is used in in applications such as radio frequency (RF) switches in semiconductor-on-insulator (SOI) substrates or bulk (non-SOI) substrates. Use of an air gap extending through two or more metal layers over a transistor gate provides a mechanism to reduce off-capacitance of any device using it by controlling one of the main contributors of intrinsic field effect transistor (FET) capacitance: the effective dielectric constant of the contact or device layer, and at least the first metal layer. Embodiments of the disclosure employ a dielectric lining layer to provide an air gap of substantially uniform width and protect certain cap layers during enlargement of the opening used to form the air gap extending through at least two metal layers.

While the teachings of the disclosure will be described with regard to an SOI substrate and relative to an RF switch, it will be understood that the embodiments can be applied to various alternative semiconductor devices such as but not limited to low noise amplifiers (LNA) and power amplifiers. Further, the teachings may be applied to different substrates, such as a bulk substrate.

Referring to FIG. 1, a cross-sectional view of a first process of a method of forming an air gap for a semiconductor device according to embodiments of the disclosure is illustrated. FIG. 1 shows a semiconductor device 100 after formation of a device layer 102, a first interconnect layer 104 and a second interconnect layer 106. First interconnect layer 104 includes a first metal layer 110 (M1) and a first via layer 112 (V0 layer), and second interconnect layer 106 includes a second metal layer 114 (M2) and a second via layer 116 (V1). The teachings of the disclosure may also be applied to devices with more interconnect layers. Device layer 102 is illustrated as including a semiconductor-on-insulator (SOI) substrate 120 including a semiconductor substrate 122 with an insulator layer 124 thereover and a semiconductor-on-insulator (SOI) layer 126 thereover. Substrate 122 and SOI layer 126 may include any semiconductor material including but not limited to silicon, germanium, silicon germanium, and silicon carbide. Furthermore, a portion or entire semiconductor substrate 122 and/or SOI layer 126 may be strained. For example, SOI layer 126 may be strained. SOI layer 126 may be segmented by shallow trench isolations (STI) 128. Insulator layer 124 may include any appropriate dielectric material for the application desired, e.g., silicon oxide ($SiO_x$) or (less commonly) sapphire. Insulator layer 124 and/or STI 128 may also include the same material, such as silicon dioxide or any other interlayer dielectric material described herein.

Figure 2:
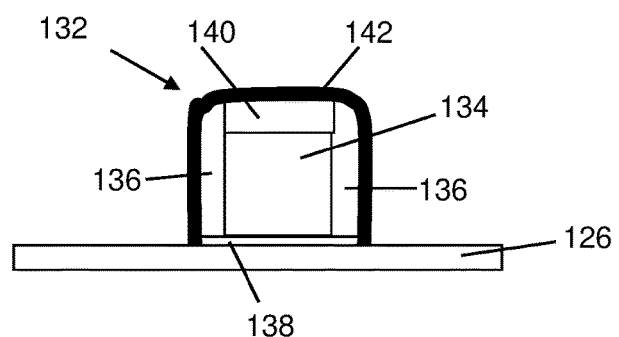
FIG. 2 shows an enlarged cross-sectional view of an illustrative transistor gate.

Device layer 102 also includes a number of transistors 130 formed therein. Each transistor 130 may include any now known or later developed transistor structure such as doped source/drain regions (not labeled) in SOI layer 126 having a transistor gate 132 thereover and therebetween. FIG. 2 shows an enlarged cross-sectional view of an illustrative transistor gate 132. Each transistor gate 132 may include, among other structures, a body 134 of polysilicon or a metal gate conductor (commonly referred to collectively as "PC"), spacers 136 about body 134, a gate dielectric 138 under body 134, a silicide layer 140 over body 134 (i.e., a silicon-metal alloy), and an etch stop layer 142 over silicide layer 140 and/or spacers 136. Spacers 136 may include any now known or later developed spacer material such as silicon nitride ($Si_3N_4$), and gate dielectric 138 may include any now known or later developed gate dielectric material such as: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Etch stop layer 142 may include any now known or later developed etch stop material such as silicon nitride. Silicide layer 140 may include any now known or later developed silicide material, e.g., titanium, nickel, cobalt, etc. As understood, each transistor gate 132 may run into, out of, or across the page as illustrated.

Returning to FIG. 1, each metal layer 110, 114 and via layer 112, 116 may include a dielectric layer 150. Dielectric layers 150 may include any now known or later developed interlayer dielectric (ILD) material. In one non-limiting example, dielectric layers 150 include a tetraethyl orthosilicate (TEOS) silicon oxide. Each metal layer 110, 114 may include a respective metal cap layer 154 at an upper surface thereof. Similarly, via layer 112 may include a respective via cap layer 156 at an upper surface thereof. Each cap layer 154, 156 may include one or more layers of, for example, a silicon oxide layer 158 and an etch stop layer 160, formed from silicon nitride (nitride), silicon carbo nitride (SiCN), etc., as known in the art. As understood, various other forms of cap layers may also be employed. Further, it is emphasized that while cap layers 154, 156 are illustrated as identical, they can be different materials, thicknesses, etc.

A number of contacts 170 may extend through dielectric layers 150 of via layers 112, 116 to various parts of device layer 102 and/or underlying metal layers, e.g., first metal layer 110. In the example shown, contacts 170 in first via layer 112 extend to source/drain regions of transistors 130. As understood, each contact 170 may include a conductor such as aluminum or copper, within a refractory metal liner of ruthenium; however, other refractory metals such as tantalum (Ta), titanium (Ti), tungsten (W), iridium (Ir), rhodium (Rh) and platinum (Pt), etc., or mixtures of thereof, may also be employed. Typically, contacts 170 extend mostly vertically within semiconductor device 100 to connect conductors in layers thereof, i.e., vertically on page as illustrated. Each metal layer 110, 114 may include a number of metal wires 172 therein. Each metal wire 172 may use the same materials as listed for contacts 170. In contrast to contacts 170, metal wires 172 extend mostly horizontally or laterally in a layer within semiconductor device 100 to connect contacts 170 therein, i.e., into, out of, or across a page as illustrated. In this manner, first metal layer 110 may include a metal wire 172 extending into or out of the page and perhaps laterally parallel to transistor gate 132 in device layer 102. Similarly, second metal layer 114 may include a metal wire 172 extending into or out of the page and perhaps laterally across the page to connect contacts in second via layer 116.

Semiconductor device 100 as illustrated in FIG. 1 can be formed using any now known or later developed semiconductor fabrication techniques, e.g., material deposition, photolithographic patterning and etching, doping, etc. Although contacts 170 and wires 172 are shown in FIG. 1 as single damascene levels, they could be formed using as dual damascene levels containing refractory metal lined copper or tungsten, as known in the art. While two interconnect layers 104, 106 each with a respective metal layer 110, 114 are illustrated, it will be readily understood that the teachings of the disclosure are applicable to any number of interconnect layers and metal layers.

"Depositing" or "deposition," as used herein, may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 also shows forming an air gap mask 176 exposing a portion 178 of an uppermost metal layer which, as shown, includes second metal layer 114 (i.e., metal cap layer 154 thereof) of second interconnect layer 106. Second metal layer 114 is over second via layer 116 of second interconnect layer 10, which is over first metal layer 110 over first via layer 112 of first interconnect layer 104, which is over device layer 102. Mask 176 may be formed, for example, after second metal layer 114 damascene planarization, e.g., via chemical mechanical polishing (CMP), and may include any now known or later developed masking material. Mask 176 is patterned and etched in a conventional fashion to create openings 180 therein. In one embodiment, transistor gate 132 width is approximately 200 nanometers (nm) and openings 180 in air gap mask 176 may have a size of approximately 160 nm to 240 nm, and in particular, 200 nm. These widths could scale with larger and smaller channel transistor width or with larger or smaller contact 170 and wire 172 width.

FIGS. 3A-E show cross-sectional views of forming an opening 200 having a depth extending into at least two metal layers 110, 114 over device layer 102 of a semiconductor structure, e.g., transistor 130 and gate 132 thereof. Opening 200 can be formed by etching opening 200 through second interconnect layer 106 and through at least first metal layer 110 of first interconnect layer 104 using air gap mask 176. Opening 200 formation generates a multi-layer opening with a single etching process rather than a two-step process, and results in a more consistent center-to-edge width. Opening 200 exposes sidewalls 202 of dielectric layers 150 of interconnect layers 104, 106 including those of first and second metal layers 110, 114 and second via layer 116 and perhaps first via layer 112. Etching generally refers to the removal of material from a substrate (or structures formed on the substrate) and is often performed with a mask in place so that material may be selectively removed from certain areas of the substrate, while leaving the material unaffected, in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., oxide) isotopically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In FIGS. 3A-E, the etching (indicated by arrows) may include a RIE. As used herein, "above the transistor gate" as it refers to opening 200 and/or any air gap 250 (FIG. 7) formed therewith, means overlapping transistor gate 132 in any fashion.

Figure 3A:
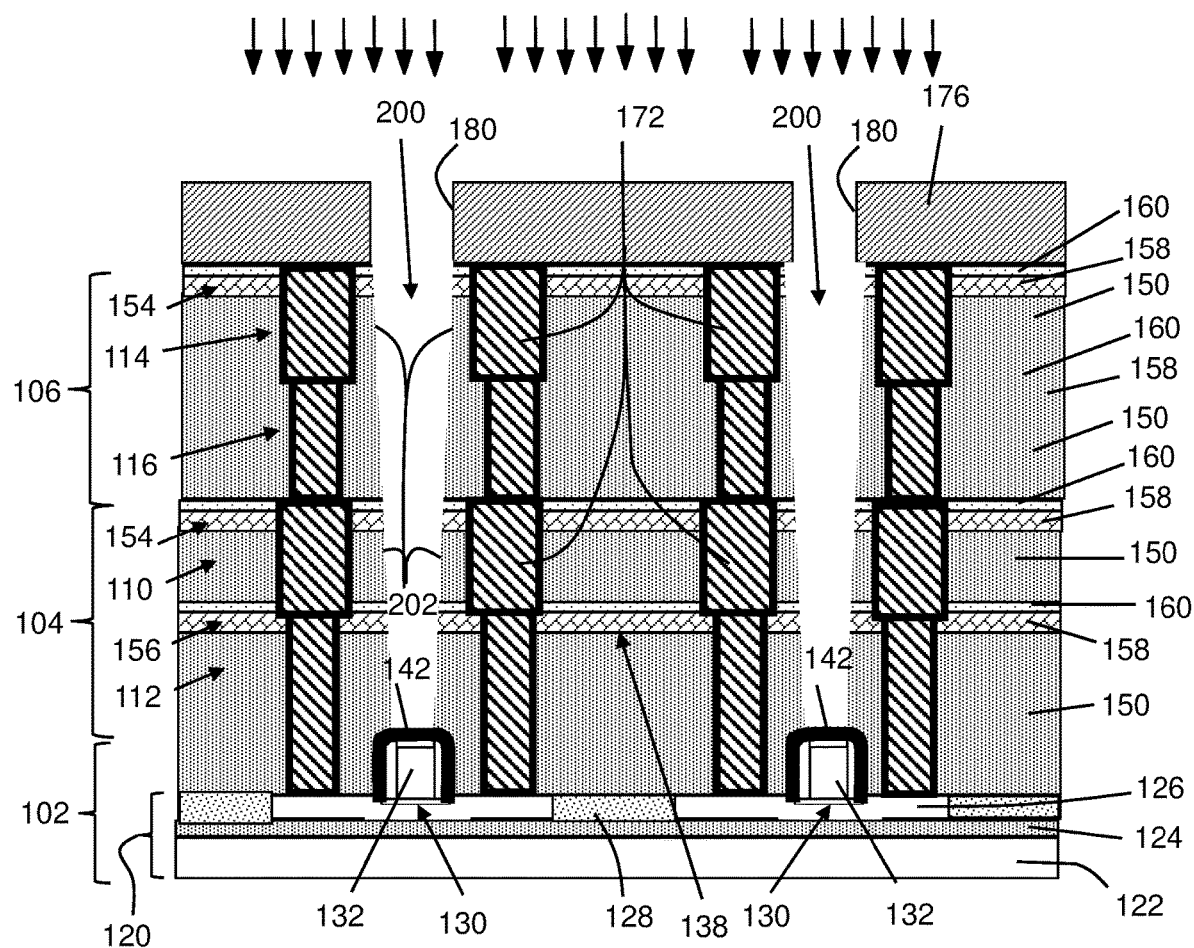
FIGS. 3A-E show cross-sectional views of etching an opening according to embodiments of a method of the disclosure.
Figure 3B:
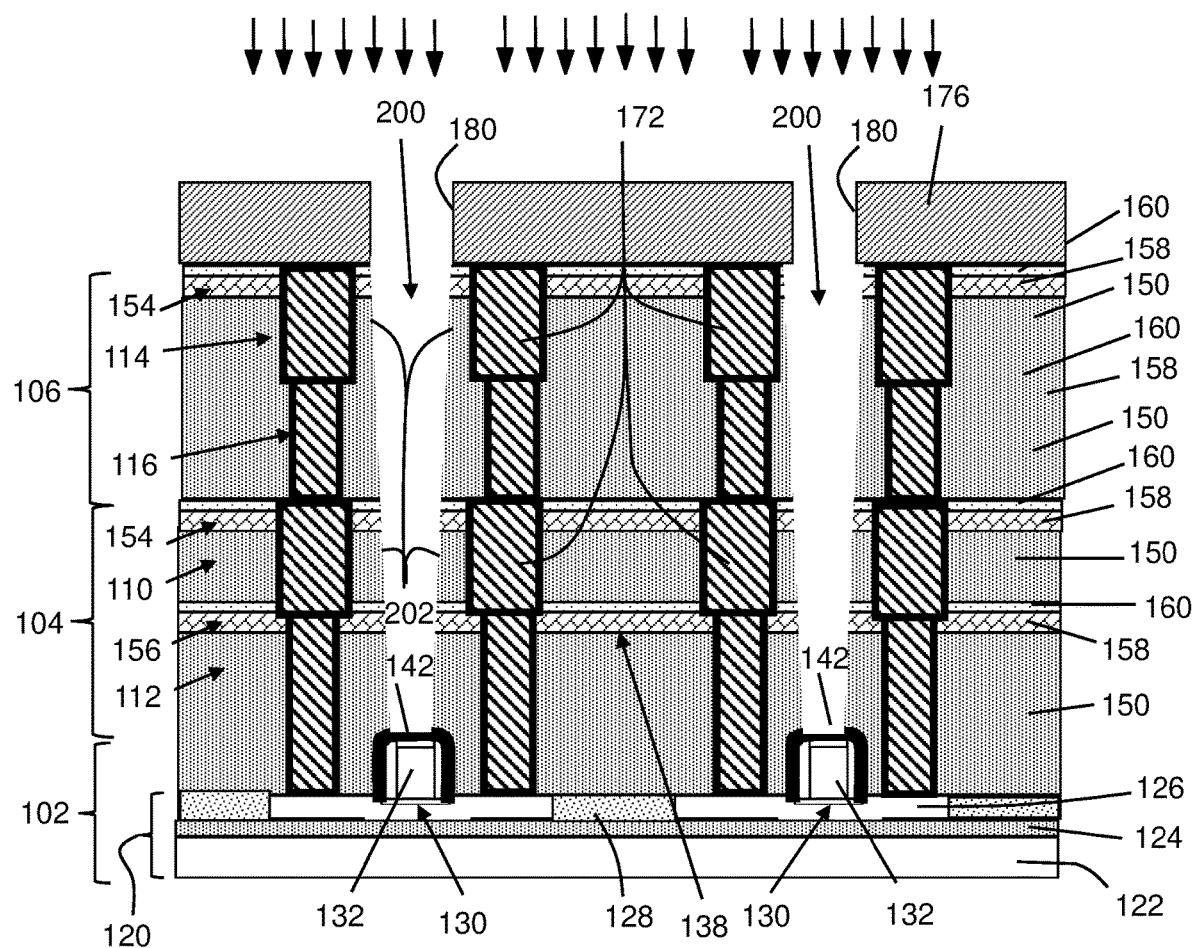
Figure 3C:
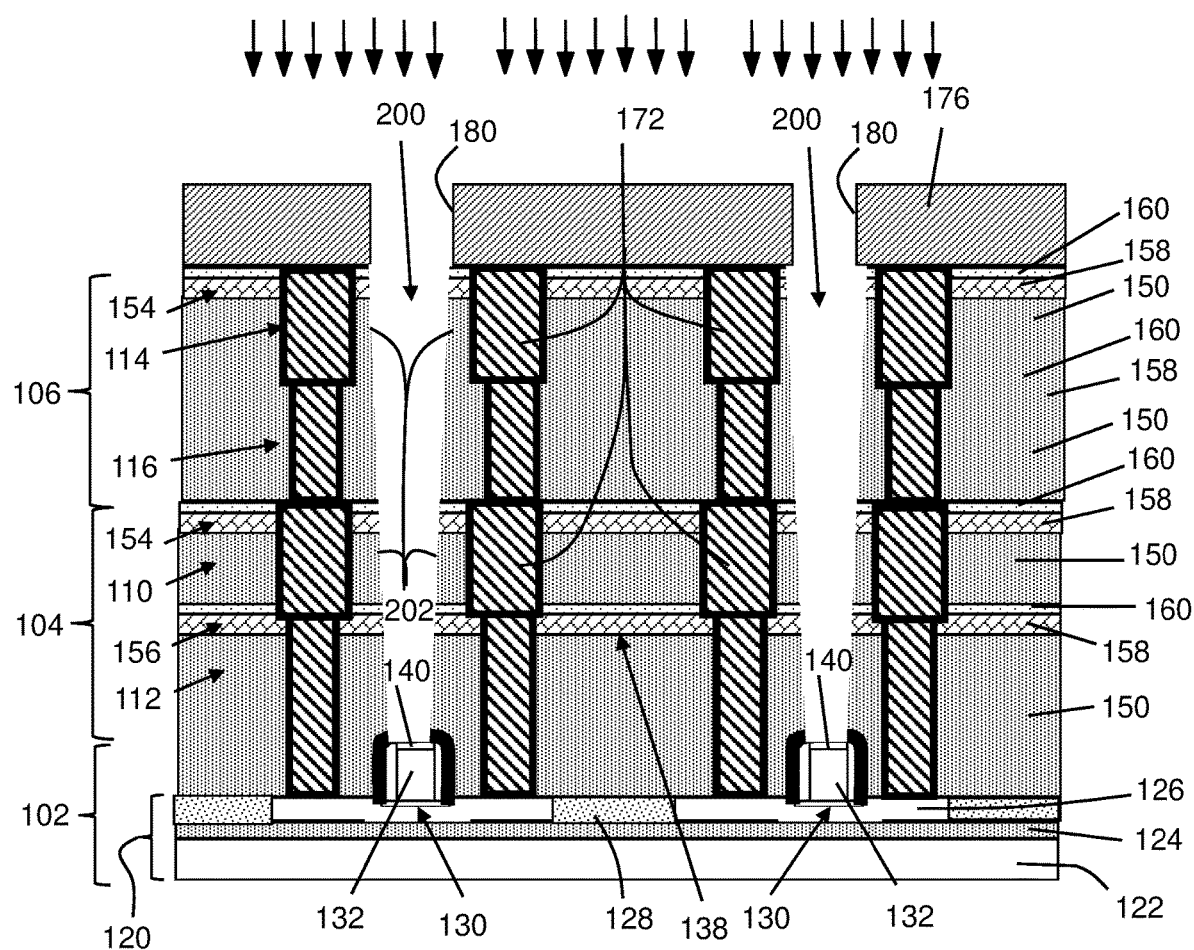
Figure 3D:
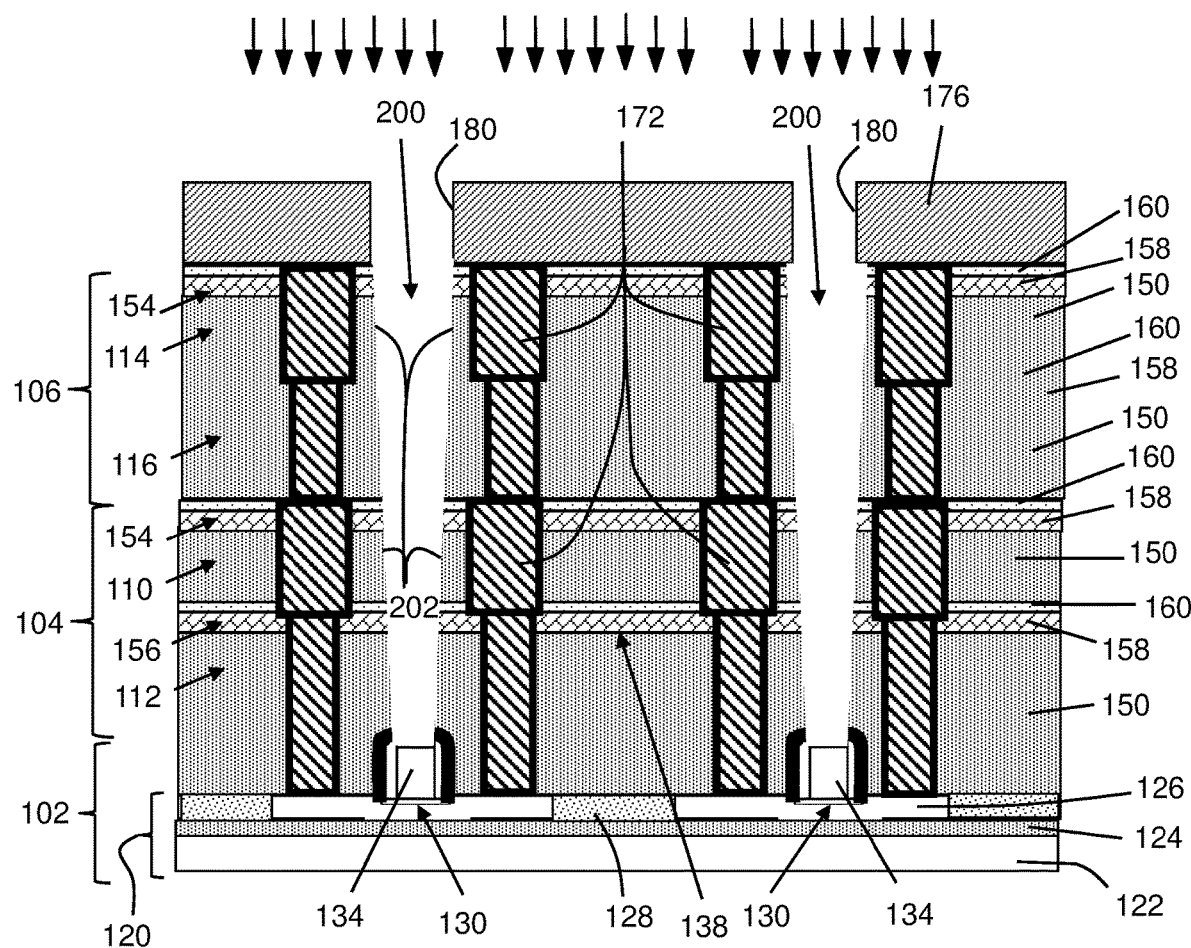
Figure 3E:
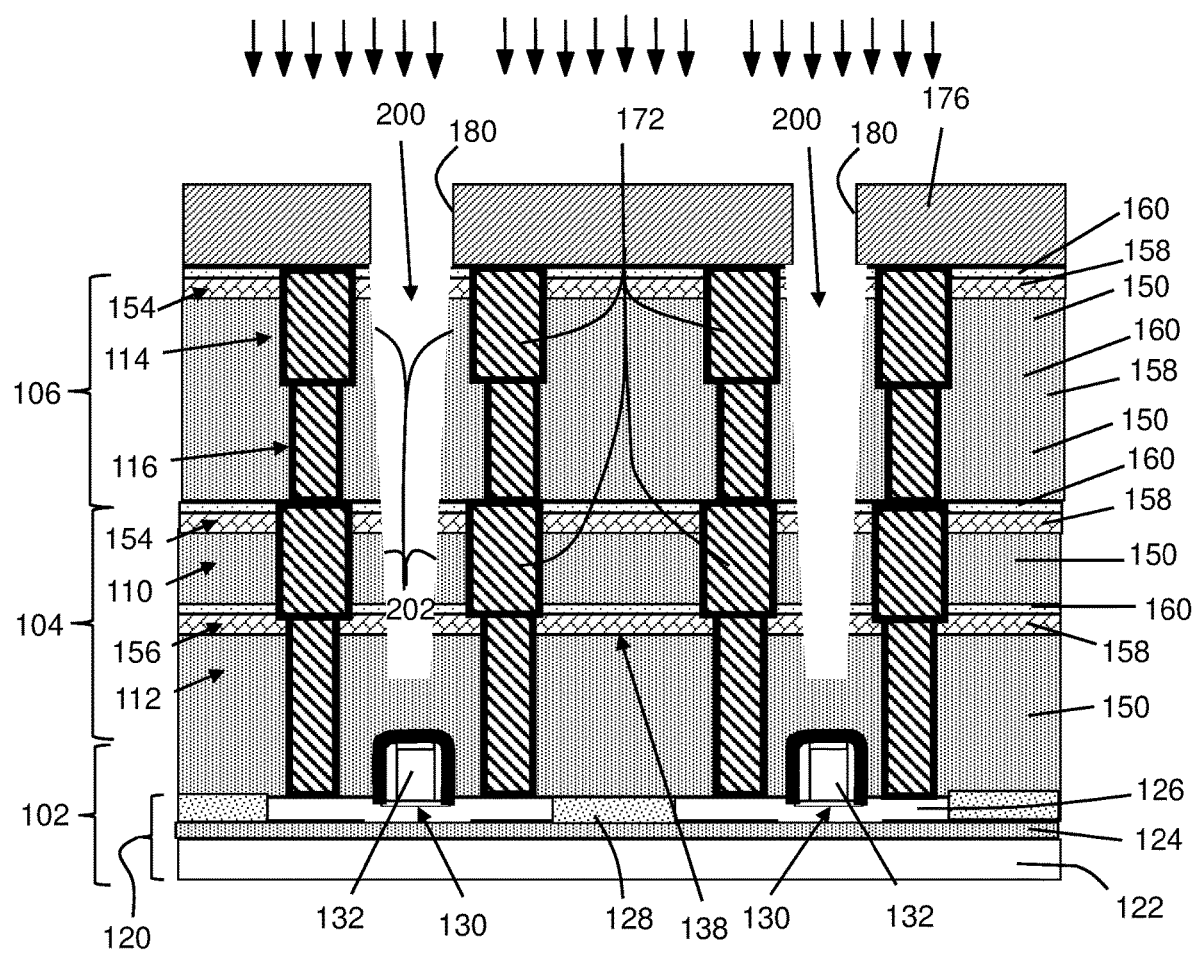

As shown in FIGS. 3A-E, opening 200 may extend above transistor gate 132 to a number of different depths. With regard to opening 200 depth, etching opening 200 may cease when: opening 200 meets or extends to etch stop layer 142 (FIG. 3A); recesses etch stop layer 142 (FIG. 3B); removes (extends beyond) etch stop layer 142 exposing silicide layer 140 (FIG. 3C); exposes body 134 (FIG. 3D), e.g., if silicide layer 140 is not present or has been removed entirely; or does not expose etch stop layer 142 by not extending entirely through dielectric layer 150 of first via layer 112 to any part of transistor gate 132 (FIG. 3E). Accordingly, the etching of FIGS. 3A-E can be controlled to select the extent of exposure of an upper surface of transistor gate 132.

Figure 4:
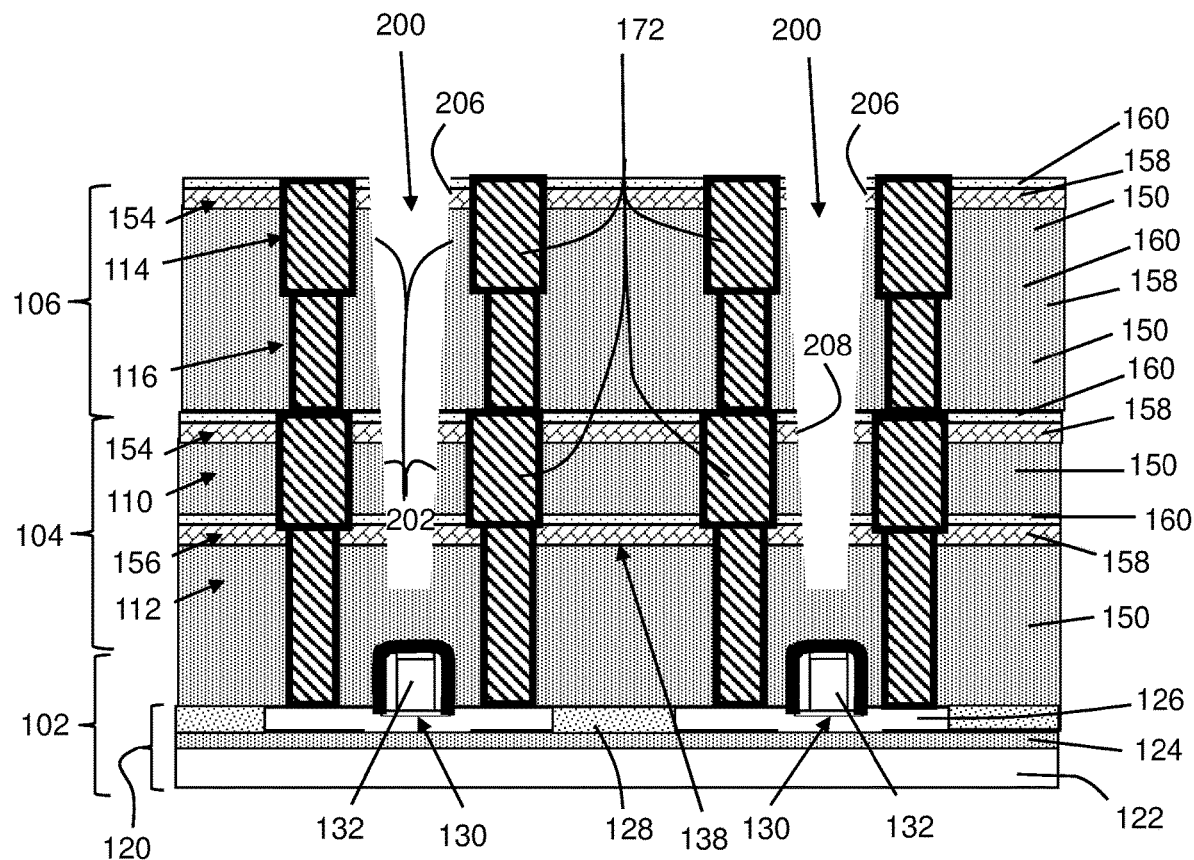
FIG. 4 shows a cross-sectional view of removing an air gap mask according to embodiments of the disclosure.

FIG. 4 shows a cross-sectional view of the semiconductor device after removing air gap mask 176 (on the FIG. 3E embodiment only for brevity). Air gap mask 176 (FIGS. 3A-E) may be removed using any now known or later developed resist strip, in-situ or ex-situ.

While two openings 200 are shown, any number of openings 200 can be formed over any number of transistor gates 132. Further, it will be recognized that openings 200 may take the form of trenches (e.g., into or out of the page, or across the page at different cross-sections of the device). In this manner, air gaps 250 (FIG. 7) formed according to embodiments of the disclosure can have a variety of different lateral layouts.

As shown in FIG. 4, forming opening 200 exposes an edge 206 of a first metal cap layer 154 over an uppermost metal layer (e.g., second metal layer 114) of the at least two metal layers 110, 114 and dielectric layer 150 under uppermost metal cap layer 114 at the upper portion of opening 200. Forming opening 200 can also expose an edge 208 of a second metal cap layer 154 over another metal layer (e.g., first metal layer 110) of the at least two metal layers 110, 114 that is under uppermost metal layer 114 and under a dielectric layer 150 under second metal cap layer 154. Similarly, edges (not numbered) of via cap layers 156 may be exposed by forming of opening 200.

At this stage of air gap formation, current practice typically enlarges opening 200 using a wet etch, e.g., using a diluted hydrofluoric (DHF) acid etch. It has been discovered that due to the depth of opening 200 through multiple metal layers 110, 114, the enlarging of opening 200 can achieve deeper depth and a wider bottom, but also lead to faster etching at the interface of dielectric layers 150 and metal cap layers 154 (also via cap layer 156). The faster etching can lead to undercutting of dielectric layers 150 to an extent that metal wires 172 (and/or contacts 170 that are close to opening 200) can be exposed. This situation is most problematic near an upper end of opening 200 where wires 172 may be closer to opening 200 than deeper in opening 200. In any event, the exposure of wires 172 (and/or contacts 170 (FIG. 1)) can create a number of faulty structures, e.g., immediately through shorts, or over time through electromigration.

Figure 5A:
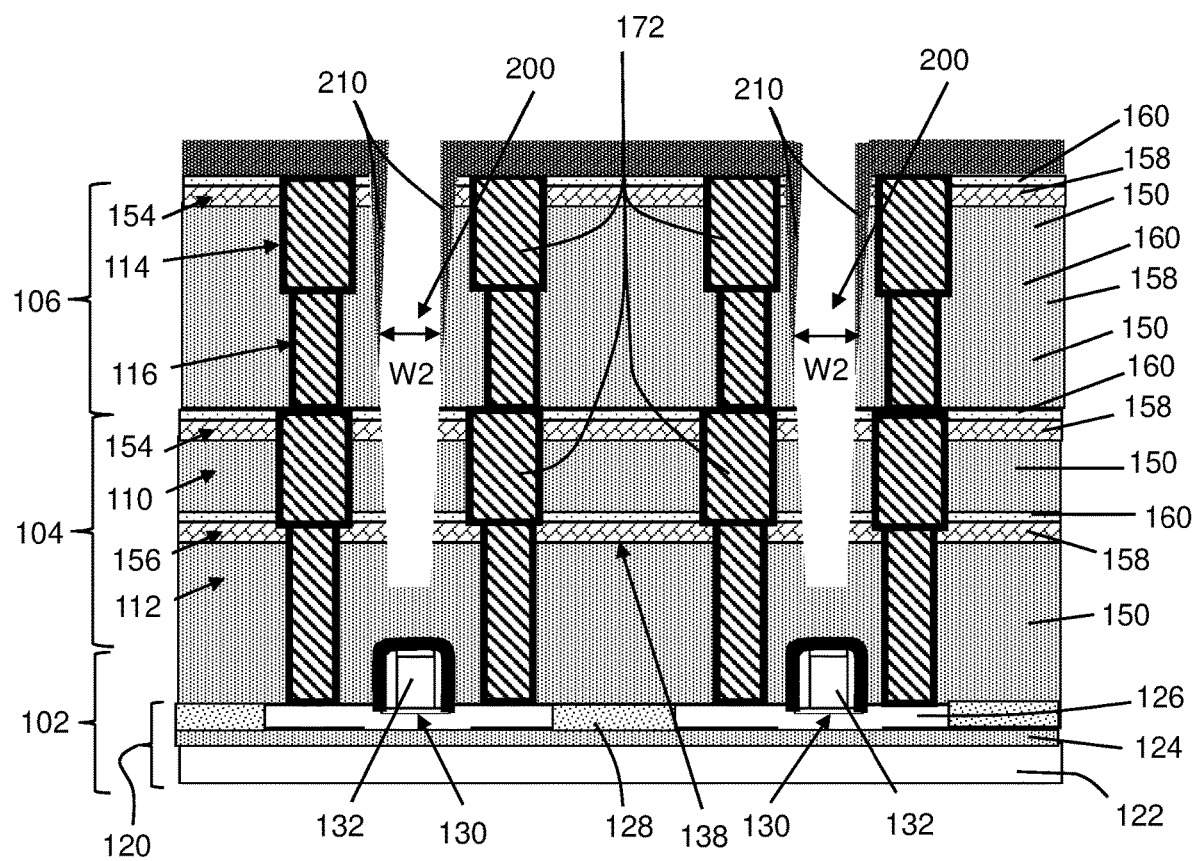
FIGS. 5A-B show cross-sectional views of forming a dielectric lining layer according to embodiments of the disclosure.
Figure 5B:
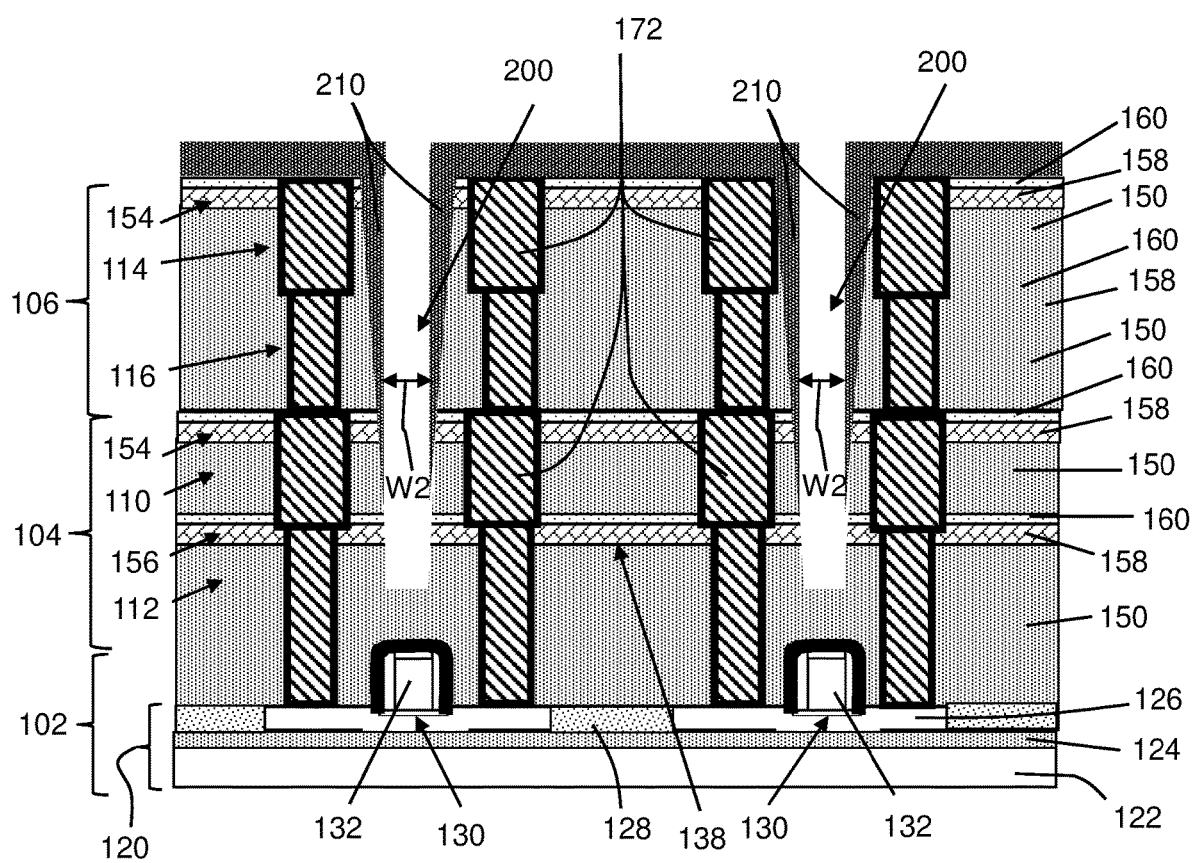

In order to address these challenges, a dielectric lining layer 210 is used to protect dielectric layers 150 from undercutting during the enlarging process. FIGS. 5A-B show cross-sectional view of forming a dielectric lining layer 210 over at least a sidewall 202 (FIG. 4) of an upper portion of opening 200. Dielectric lining layer 210 may include, for example, PECVD, ALD, SACVD or HDPCVD silicon oxide, or other low dielectric constant films. Dielectric lining layer 210 may be formed over at least the sidewall of the upper portion of opening 200. In FIGS. 5A-B, dielectric lining layer 210 extends over metal cap layer 154 of uppermost metal layer 114. In FIG. 5A, dielectric lining layer 210 extends over sidewalls of only uppermost metal layer 114 and perhaps at least some of uppermost via layer 116, i.e., in opening 200. As noted, forming opening 200 exposes an edge 206 (FIG. 4) of metal cap layer 154 of uppermost metal layer 114 (here, second metal layer 114) of the at least two metal layers and dielectric layer 150 under metal cap layer 154 (of second metal layer 114) at the upper portion of opening 200. In this case, forming dielectric lining layer 210 over at least the sidewall of the upper portion of opening 200 forms dielectric lining layer 210 over metal cap layer 154 of second metal layer 114 including edge 206 (FIG. 4) thereof, and over at least a portion of a sidewall of dielectric layer 150 of second metal layer 114 and perhaps at least some of dielectric layer 150 of second via layer 116. In FIG. 5B, dielectric lining layer 210 may extend farther along sidewalls of opening 200. As noted, forming opening 200 may also expose an edge of a second metal cap layer 154 over another metal layer 110 (e.g., first metal layer) of the at least two metal layers that is under the uppermost metal layer 114 (e.g., second metal layer) and a (second) dielectric layer 150 under the second metal cap layer 154 (of first metal layer 110). In this embodiment, forming dielectric lining layer 210 over at least the sidewall of the upper portion of opening 200 also forms dielectric lining layer 210 over the edge of metal cap layer 154 of first metal layer 110 and perhaps over at least a portion of a sidewall of dielectric layer 150 of first metal layer 110. Dielectric lining layer 210 also extends over sidewalls of dielectric layer 150 of: uppermost metal layer 114, via layer 116 and at least some of first metal layer 110. Dielectric lining layer 210 can be provided over any structure requiring protection from over-etching during the enlarging process.

Figure 6A:
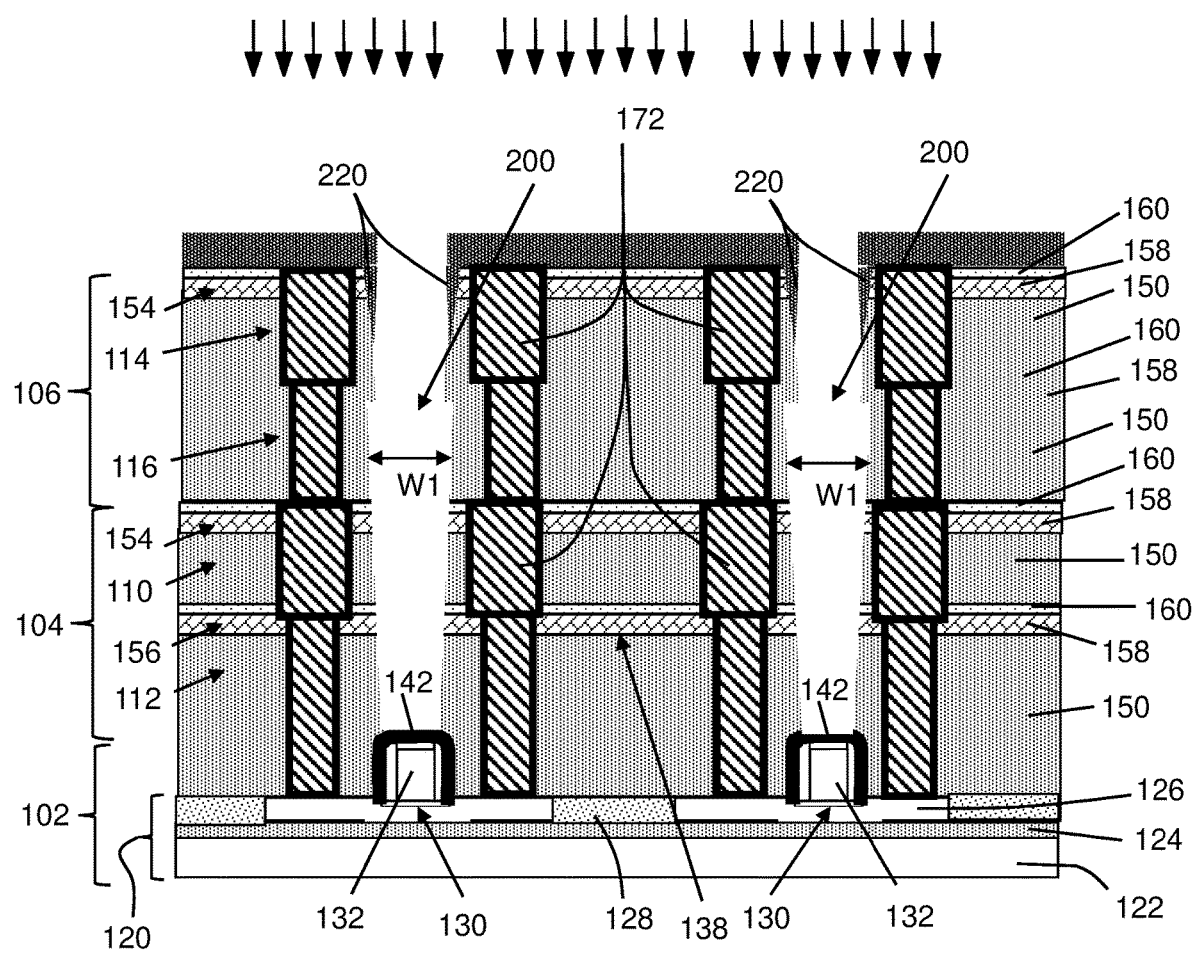
FIGS. 6A-C show cross-sectional views of enlarging the opening according to embodiments of the disclosure.
Figure 6B:
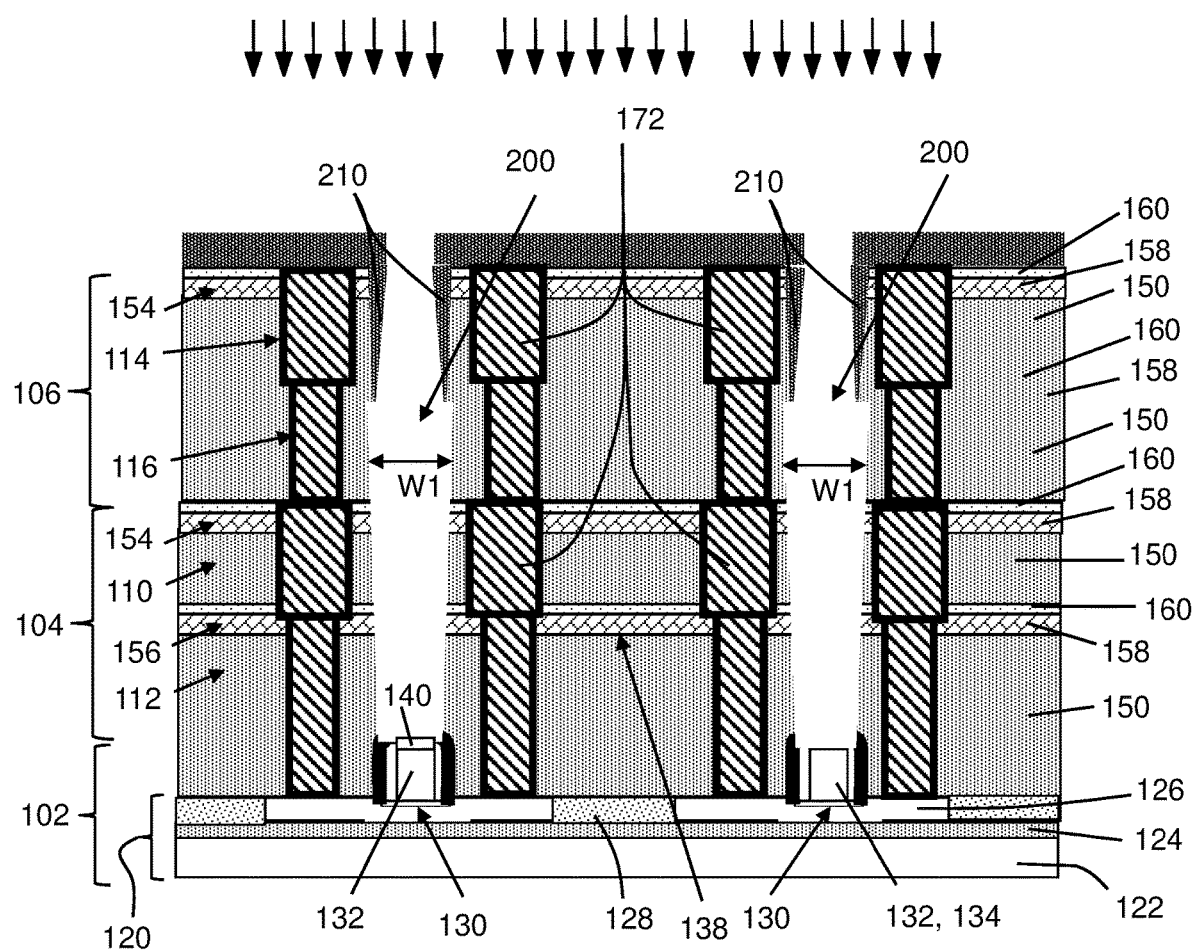
Figure 6C:
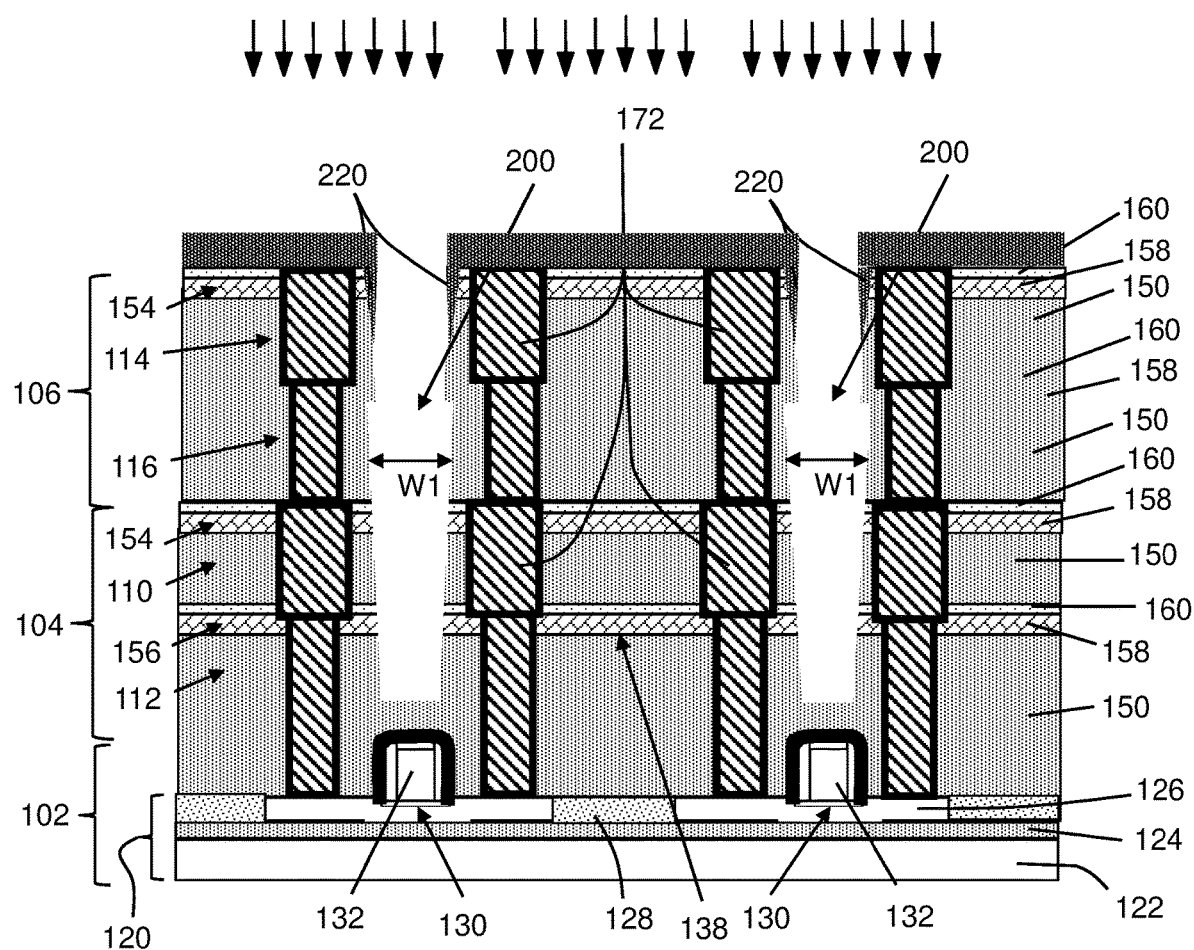

FIGS. 6A-C show cross-sectional views of enlarging at least a portion of opening 200 that is not covered by dielectric lining layer 210. The enlarging exposes sidewalls of dielectric layer 150 of interconnect layers 104, 106 in opening 200. Among other benefits, the enlarging of sidewalls acts to enlarge opening 200 and thus air gaps 250 (FIG. 7), reducing the effective dielectric constant of interconnect layers 104, 106 while leaving the air gap top opening to be sealed in the next process step narrower than the air gap itself. If silicon oxide films are used for dielectric layers 150 of metal layers 110, 114 and silicon nitride is used for cap layer(s) 154, 156, then a hydrofluoric acid (HF) wet etch could be used for this enlarging process (indicated by arrows in FIGS. 6A-C only for brevity). HF concentrations could be in the range of, for example, 10:1 to 500:1 dilution with water, as known in the art. Because dielectric layers 150 etch faster than the dielectric of cap layer(s) 154, 156 (FIG. 1), FIGS. 6A-6C shows that opening 200 width W1, for example, is wider than width W2 (FIGS. 5A-B) at the same location prior to enlarging. In one embodiment, shown in FIGS. 6A-C, recessing exposed sidewalls of dielectric layers 150 of interconnect layers 104, 106 in opening 200 may expose an edge of at least one of metal cap layer 154 of first metal layer 110, as shown, and perhaps edges of via cap layers 156 of one or more of via layers 112, 116. However, dielectric lining layer 210 protects edge 206 (FIG. 4) of uppermost metal layer 114. The enlarging process may remove most of dielectric lining layer 210, but some of dielectric lining layer 210, referred to as remnants 220 herein, remain in opening 200, and hence, will be on a sidewall of air gap 250 (FIG. 7) formed in opening 200. As will be described, remnants 220 of dielectric lining layer 210 may also assist in closing opening 200 to form an air gap, e.g., by facilitating the pinching-off of opening 200. The enlarging process may also remove most of dielectric lining layer 210 over metal cap layer 154, but some of dielectric lining layer 210, referred to as remnant layer 222 herein, may remain in over metal cap layer 154 of uppermost metal layer 114. In one non-limiting example, opening 200 may have an average width of 160 nm, i.e., within 135-185 nm, after the enlarging.

As shown in FIGS. 6A-C, the enlarging process at this stage can also be used to further deepen opening 200. Assuming, for example, recessing occurred after air gap mask 176 removal in FIG. 4, but with the FIG. 3E embodiment in which dielectric layer 150 remains above transistor gate 132, recessing as shown in FIGS. 6A-C can further deepen opening 200 to any of the depths shown in FIGS. 3A-D. For example, where opening 200 did not extend through dielectric layer 150 to meet or contact etch stop layer 142 (FIG. 2), recessing may extend opening 200 thereto (FIG. 6A, left side). Similarly, recessing could extend opening 200 to recess etch stop layer 142 (FIG. 6A, right side) or expose silicide layer 140 (FIG. 6B, left side), or expose body 134 (FIG. 6B, right side). Further, recessing could extend opening 200 further into dielectric layer 150 of first via layer 112, without exposing any part of gate 132 (FIG. 6C). In this fashion, the extent to which transistor gate 132 is exposed to an air gap 250 (FIG. 7) formed from opening 200 can be precisely controlled in addition to the control provided by the etching of FIGS. 3A-E.

Figure 7:
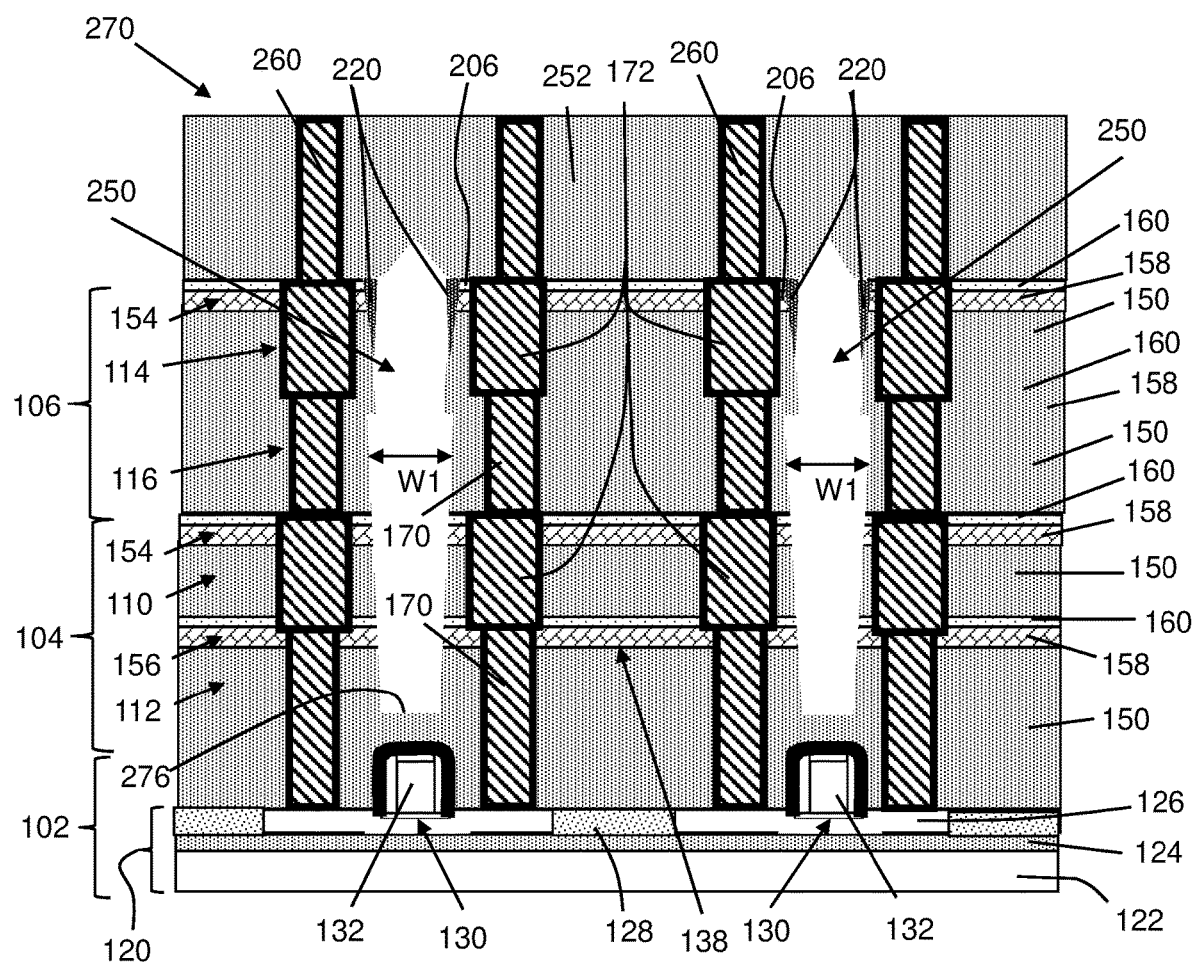
FIG. 7 shows a cross-sectional view of a method and a semiconductor device such as a radio frequency SOI switch with an air gap over a transistor gate thereof according to embodiments of the disclosure.
Figure 8:
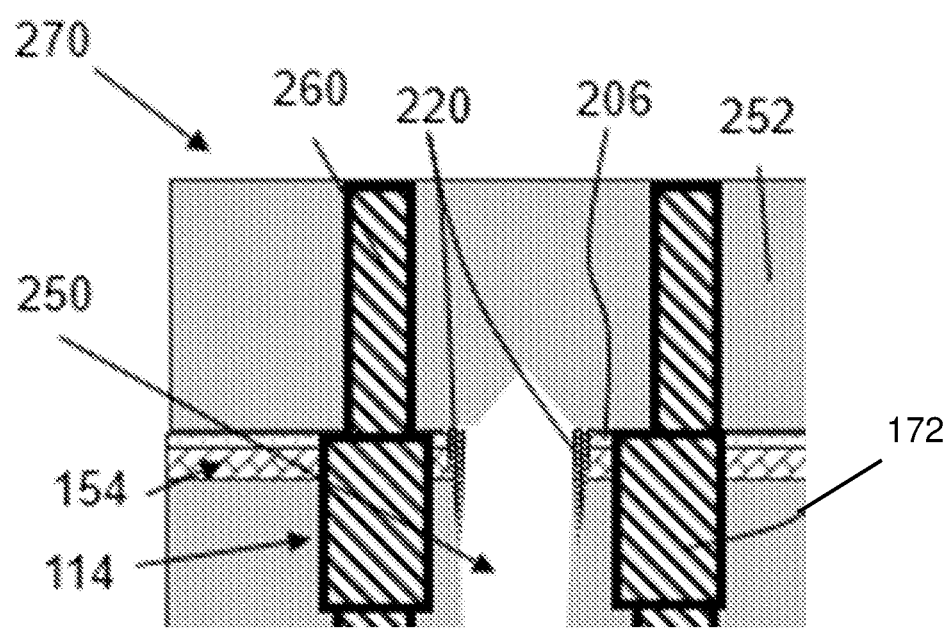
FIG. 8 shows an enlarged cross-sectional view of an upper portion of an air gap in FIG. 7.

FIG. 7 shows a cross-sectional view of forming an air gap 250 through at least two metal layers 110, 114 by forming an interlayer dielectric layer 252 over opening 200 to seal opening 200. FIG. 8 shows an enlarged cross-sectional view of air gap 250 in FIG. 7. FIG. 7 shows air gap 250 formation relative to the FIG. 6C embodiment only, but it will be understood that air gap 250 can be formed with any of the arrangements shown in FIGS. 6A-B. Air gap 250 is formed over transistor gate 132 by depositing ILD layer 252, the latter of which acts as an air gap capping layer to seal opening 200 (FIG. 6A-C) at a surface of uppermost metal layer 114. As shown, air gap 250 is vertically aligned with transistor gate 132, although perfect alignment is not necessary in all cases. ILD layer 252 may include any dielectric material capable of sealing opening 200 and acting as an ILD for a next via layer to be formed therein. In one embodiment, ILD layer 252 may include chemical vapor deposited (CVD) dielectric. In another embodiment, ILD layer 252 may include a plasma-enhanced chemical vapor deposition (PECVD) silane oxide. PECVD silane oxide may be chosen because it has very poor step coverage, resulting in a larger air gap volume. In other embodiments, ILD layer 252 may include a thin silicon nitride layer with an ILD oxide, such as a PECVD TEOS-based, PVD, or similar oxide (individual layers not shown for clarity). Remnants 220 of dielectric lining layer 210 (FIGS. 6A-C) over edges 206 (FIG. 4) of uppermost metal cap layer 156 (FIG. 4) of uppermost metal layer 114 assist in pinching opening 200 to assist in closing air gap 250. Air gap 250 does not expose any contact 170 or metal wire 172, i.e., dielectric layer 150 of interconnect layers 104, 106. That is, dielectric layer 150 and/or remnants 220 of dielectric lining layer 210 about air gap 250 cover any conductive wire 172 in first metal layer 110 and second metal layer 114 or any conductive contact 170 in first via layer 112 and second via layer 116.

As shown in FIG. 7, air gap 250 extends vertically across at least two metal layers 110, 114. More particularly, air gap 250 vertically extends above and below metal wires 172 in first metal layer 110 and second metal layer 114, i.e., below dielectric layer 150 of first metal layer 110 and above metal wire 172 in second metal layer 114. Air gap 250 also extends above an upper surface of second metal layer 114. As also shown in FIG. 7, air gap 250 may vertically extend only partially into ILD layer 252 that caps the air gap, so that layer 252 can act as a dielectric for a third via layer with minimal interference from air gap 250. Vias 260 can extend to another metal layer (not shown) that may be formed in ILD layer 252 or a dielectric layer thereover, using any conventional or later developed technique. ILD layer 252 seals opening 200 (FIGS. 6A-C) regardless of the lateral layout. The lateral formation of opening 200 can be controlled to avoid exposure thereof by subsequently formed vias 260, thus preventing via 260 conductor from entering air gap 250.

Referring to FIGS. 7 and 8, a semiconductor device 270 according to embodiments of the disclosure is also shown. FIG. 8 shows an enlarged version of the upper end of air gap 250 as in the cross-sectional view of FIG. 7. In one embodiment, semiconductor device 270 may include device layer 102 including transistor gate 132 of transistor 130. Transistor gate 132 may include body 134, silicide layer 140 over body 134, and etch stop layer 142 over silicide layer 140. Transistor 130 can take the form of any now known or later developed complementary metal-oxide semiconductor (CMOS) field effect transistor (FET). Semiconductor device 270 can also include at least two metal layers 110, 114 over device layer 102. Metal layers 110, 114 may be part of interconnect layers 104, 106, respectively, over device layer 102. Interconnect layer 104 may include one or more interconnect layers including, for example, first via layer 112 and first metal layer 110; and interconnect layer 106 may include one or more interconnect layers including, for example, second via layer 116 and second metal layer 114.

Semiconductor device 270 also includes air gap 250 extending through each of the at least two metal layers 110, 114. Air gap 250 is contiguous through the at least two metal layers 110, 114, i.e., there is no break in the air gap. The at least two metal layers may include at least a first metal layer 110 over device layer 102 and second metal layer 114 over first metal layer 110. Air gap 250 may extend through any number of additional metal layers, e.g., a third, fourth, fifth metal layer and any intervening via layers. Use of dielectric lining layer 210 allows air gap 250 to extend through multiple metal layers and yet have a substantially uniform width, i.e., compared to stacked air gaps separated by a cap layer formed using a two-step process. Air gap 250 is over transistor gate 132 in device layer 102 below a lowermost metal layer, e.g., first metal layer 110, of the at least two metal layers.

Semiconductor device 270 may also include metal cap layer 154 as part of an uppermost metal layer (e.g., second metal layer 114). Metal cap layer 154 of second metal layer 114 is over dielectric layer 150 of first metal layer 110 (with second via layer 116 therebetween). Dielectric lining layer 210, and more particularly, remnants 220 thereof, are between air gap 250 and an edge 206 (FIG. 4) of metal cap layer 154 of the uppermost metal layer 114. Air gap 250 includes ILD layer 252 sealing an upper end of the air gap. Dielectric lining layer 210 assists in forming air gap 250 with a substantially uniform width. As used herein, "substantially uniform width" indicates the width is within a tolerance of +/−25 nm. In a non-limiting example, an air gap 250 extending over two metal layers 110, 114 may have an average width of approximately 125 nm, i.e., substantially uniform being within 100-150 nm with a tolerance of +/−25 nm, and a height of approximately 850 nm. (Note, a film layer from ILD layer 252 formation (not shown) narrows width from that present after the enlarging.) In one embodiment, air gap 250 may have a height-to-width ratio greater than approximately 6.5. Other dimensions are also possible. Air gap 250 may have a planar bottom 276 (FIG. 7), which improves the capacitance reduction of air gap 250 compared to air gaps having a pointed or tipped bottom. Although not shown, air gap 250 may be laterally elongated into and out of the page and may have any desired lateral layout.

Figure 9:
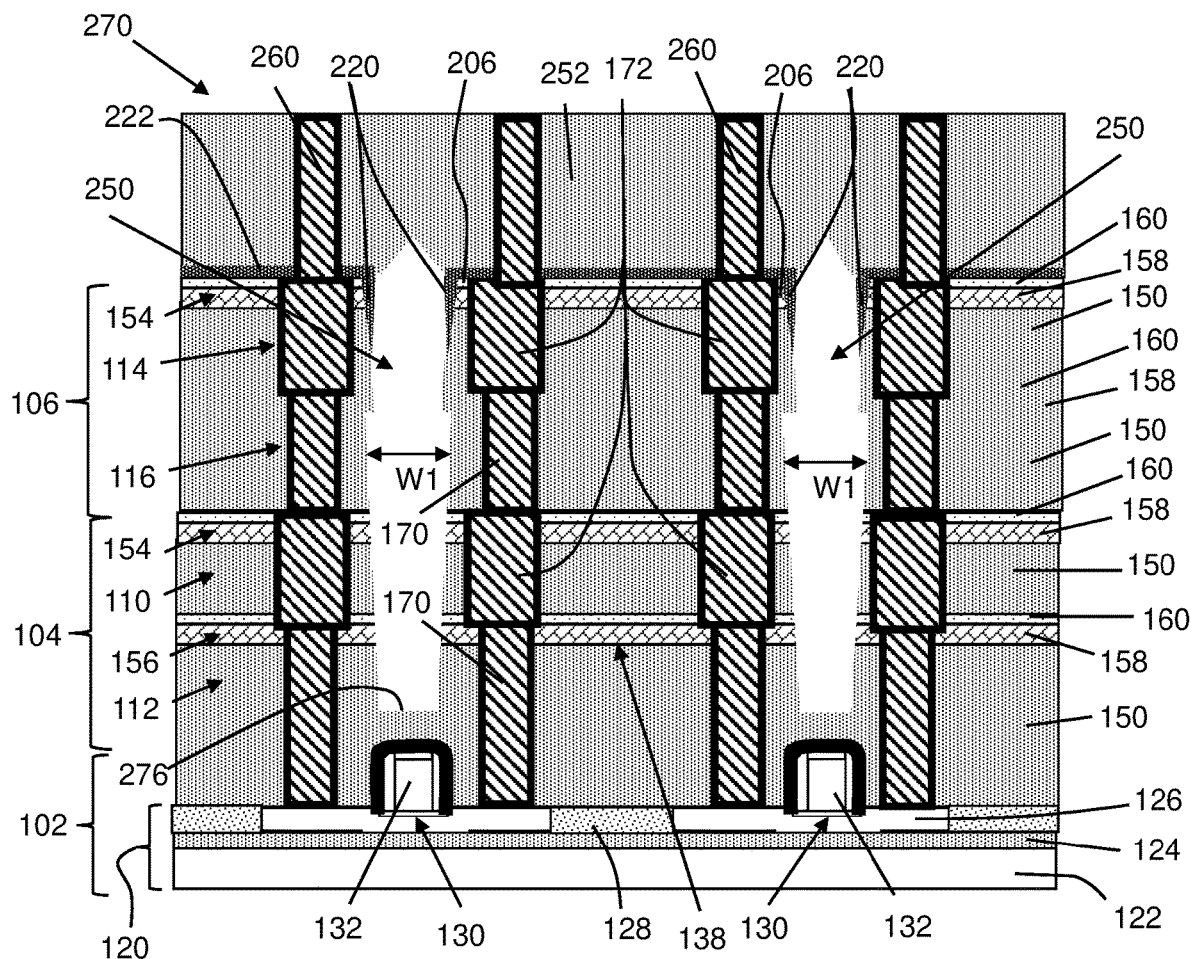
FIG. 9 shows a cross-sectional view of a method and a semiconductor device such as a radio frequency SOI switch with an air gap over a transistor gate thereof according to another embodiment of the disclosure.

Any number of air gaps 250 can be provided with each air gap 250 extending through each of the at least two metal layers 110, 114, etc., and above a respective transistor gate 132. As shown in FIG. 9, where the enlarging process (FIGS. 6A-C) does not remove all dielectric lining layer 210 over metal cap layer 154 of uppermost metal layer 114, remnant layer 222 of dielectric lining layer 210 may remain over metal cap layer 154 of uppermost metal layer 114 in semiconductor device 270.

As described, the extent to which transistor gate 132, i.e., upper surface thereof, is exposed and/or what part of gate 132 is exposed to air gap 250 can be controlled through the etching, enlarging and capping processes. As understood, air gap 250 can be formed with any embodiment of opening 200 provided. That is, air gap 250 may meet or extend to etch stop layer 142 (left side of FIG. 6A); extend into etch stop layer 142 (right side FIG. 6A) not exposing silicide layer 140 (FIG. 2); remove etch stop layer 142 (and perhaps parts of spacers 136) exposing silicide layer 140 (FIG. 6B, left side); if silicide layer 142 is not present or has been removed entirely, expose a portion of body 134 (FIG. 6B, right side); or if a thin layer of capping material (not shown) has been deposited into opening 200 or opening 200 does not extend through dielectric layer 150 of first via layer 112 (FIGS. 6C and 7), extend to the capping layer or dielectric layer 150 over transistor gate 132. Consequently, above transistor gate 132, an air gap 250 may contact dielectric such as dielectric layer 150 or a cap layer (not shown), contact etch stop layer 142 (either full or recessed), contact silicide layer 140 or contact body 134 of transistor gate 132. In any event, remnants 220 of dielectric lining layer 210 and/or dielectric layer 150 of interconnect layers 104, 106 cover any conductor, e.g., any conductive wire 172 in first metal layer 110 or second metal layer 114 or any conductive contact 170 in via layers 112, 116. At least edge 206 (FIG. 4) of an uppermost metal cap layer(s) 154 is covered by remnants 220 of dielectric lining layer 210 (FIGS. 5A-B).

As will be recognized, semiconductor device 270 can be used to form a variety of devices such as a radio frequency semiconductor-on-insulator (RFSOI) switch, a low amplitude amplifier, a power amplifier, etc. Use of air gap 250 over transistor gate 132 according to the various embodiments of the disclosure provides a mechanism to reduce off-capacitance and on-resistance of any device using it by controlling one of the main contributors of intrinsic FET capacitance: the effective dielectric constant of first via layer 112 and first metal layer 110.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
    forming an opening having a depth extending into at least two metal layers over a device layer, wherein the device layer includes a transistor gate;
    forming a dielectric liner over at least a sidewall of an upper portion of the opening such that the dielectric liner is vertically between the air gap and a sidewall of a cap layer;
    enlarging at least a portion of the opening that is not covered by the dielectric liner;
    forming an air gap through the at least two metal layers by forming an interlayer dielectric layer over the opening to seal the opening, wherein some of the dielectric liner remains on a sidewall of the air gap and an upper metal layer of the at least two metal layers includes the cap layer on a dielectric material in the upper metal layer.

2. The method of claim 1, wherein the enlarging includes exposing the opening to a diluted hydrofluoric (DHF) acid etch.

3. The method of claim 1, wherein the enlarging enlarges a width and depth of the opening.

4. The method of claim 1, wherein the at least two metal layers includes a lower metal layer that is part of a first interconnect layer also including a first via layer, and an upper metal layer that is part of a second interconnect layer also including a second via layer, wherein the air gap extends through the second via layer and part of the first via layer.

5. The method of claim 1, wherein the air gap is over the transistor gate in the device layer below a lowermost metal layer of the at least two metal layers.

6. The method of claim 5, wherein forming the opening exposes an edge of the cap layer over an uppermost metal layer of the at least two metal layers and a first dielectric layer under the cap layer at the upper portion of the opening;
    wherein forming the dielectric liner over the at least the sidewall of the upper portion of the opening forms the dielectric liner over the cap layer including the edge of the cap layer and over at least a portion of a sidewall of the first dielectric layer; and
    wherein the dielectric liner remains on at least the edge of the cap layer and the at least a portion of the sidewall of the first dielectric layer after the enlarging.

7. The method of claim 6, wherein forming the opening exposes an edge of a second cap layer over another metal layer of the at least two metal layers that is under the uppermost metal layer and a second dielectric layer under the second cap layer; and
    wherein forming the dielectric liner over the at least the sidewall of the upper portion of the opening also forms the dielectric liner over the edge of the second cap layer and over at least a portion of a sidewall of the second dielectric layer.

8. The method of claim 6, wherein the dielectric liner remains over the cap layer, and wherein the dielectric liner physically isolates the cap layer from the air gap.

9. A semiconductor device, comprising:
a device layer including a transistor gate;
at least two metal layers over the device layer;
an air gap extending through each of the at least two metal layers, wherein an upper metal layer of the at least two metal layers includes a cap layer on a dielectric material in the upper metal layer; and
a dielectric liner vertically between the air gap and a sidewall of the cap layer.

10. The semiconductor device of claim 9, wherein the at least two metal layers includes at least a first metal layer over the device layer and a second metal layer over the first metal layer.

11. The semiconductor device of claim 9, wherein an uppermost metal layer of the at least two metal layers includes the cap layer over a dielectric layer of the uppermost metal layer, and wherein the dielectric liner physically isolates the cap layer from the air gap.

12. The semiconductor device of claim 11, wherein the dielectric liner extends over the cap layer of the uppermost metal layer.

13. The semiconductor device of claim 11, wherein the dielectric liner extends over the dielectric layer of the uppermost metal layer.

14. The semiconductor device of claim 9, wherein the air gap has a substantially uniform width.

15. The semiconductor device of claim 9, wherein the air gap has a planar bottom.

16. The semiconductor device of claim 9, wherein the air gap includes an interlayer dielectric layer sealing an upper end of the air gap.

17. A radio frequency semiconductor-on-insulator (RF-SOI) switch, comprising:
a transistor gate in a semiconductor-on-insulator (SOI) device layer of an SOI substrate;
at least two metal layers over the SOI device layer;
an air gap extending through each of the at least two metal layers, wherein an upper metal layer of the at least two metal layers includes a cap layer on a dielectric material in the upper metal layer; and
a dielectric liner vertically between the air gap and a sidewall of the cap layer.

18. The RFSOI switch of claim 17, wherein an uppermost metal layer of the at least two metal layers includes the cap layer over a dielectric layer of the uppermost metal layer, and wherein the dielectric liner physically isolates the cap layer from the air gap.

19. The RFSOI switch of claim 18, wherein the dielectric liner extends over the cap layer of the uppermost metal layer.

20. The RFSOI switch of claim 17, wherein the air gap has a substantially uniform width, and a planar bottom.

* * * * *